(12) United States Patent
Mikami et al.

(10) Patent No.: US 8,029,954 B2
(45) Date of Patent: Oct. 4, 2011

(54) EXPOSURE METHOD AND MEMORY MEDIUM STORING COMPUTER PROGRAM

(75) Inventors: Koji Mikami, Nikko (JP); Kouichirou Tsujita, Utsunomiya (JP); Hiroyuki Ishii, Shioya-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 78 days.

(21) Appl. No.: 12/499,730

(22) Filed: Jul. 8, 2009

(65) Prior Publication Data

US 2010/0009275 A1    Jan. 14, 2010

(30) Foreign Application Priority Data

Jul. 11, 2008   (JP) ................. 2008-181977

(51) Int. Cl.
G03F 9/00 (2006.01)
G03C 5/00 (2006.01)

(52) U.S. Cl. ........................................ 430/30
(58) Field of Classification Search ............ 430/30
See application file for complete search history.

(56) References Cited

U.S. PATENT DOCUMENTS

| | | |
|---|---|---|
| 6,839,125 B2 | 1/2005 | Hansen |
| 7,016,017 B2 | 3/2006 | Hansen |
| 7,030,966 B2 | 4/2006 | Hansen |
| 7,180,576 B2 | 2/2007 | Hansen |
| 7,245,356 B2 | 7/2007 | Hansen |
| 7,471,375 B2 | 12/2008 | Hansen et al. |

FOREIGN PATENT DOCUMENTS

JP    2004-247737 A    9/2004

*Primary Examiner* — Christopher Young

(74) *Attorney, Agent, or Firm* — Canon U.S.A., Inc., IP Division

(57) ABSTRACT

A method comprises determining an exposure condition by executing a process including computing an image formed on an image plane under the current exposure condition while changing the exposure condition, and evaluating a line width of the computed image, and exposing the substrate under the determined exposure condition, wherein the determining includes, computing a simplified evaluation value of the computed image, changing the exposure condition and executing the process in the changed exposure condition, after evaluating the computed image if the simplified evaluation value satisfies an allowable value, and changing the exposure condition and executing the process in the changed exposure condition without evaluating the computed image if the simplified evaluation value does not satisfy the allowable value.

10 Claims, 14 Drawing Sheets

ANNULAR LIGHT-EMITTING PORTION

QUADRUPOLE LIGHT-EMITTING PORTION

F I G. 12A
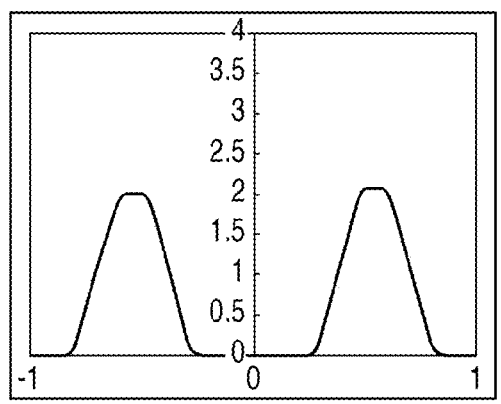
F I G. 12C
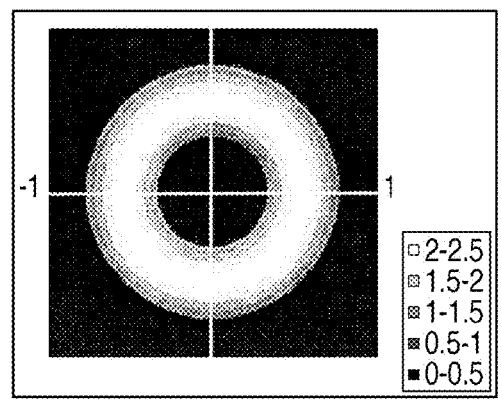
F I G. 12B
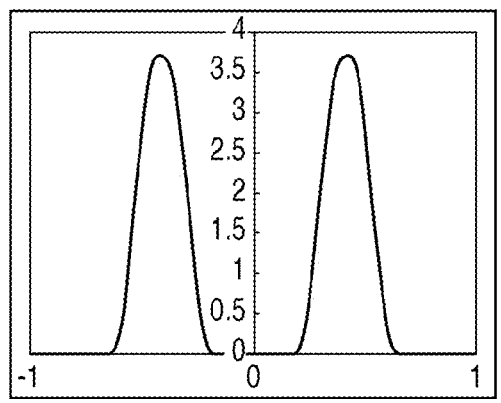
F I G. 12D
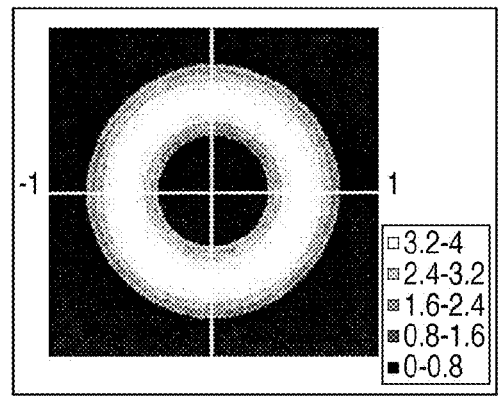

F I G. 14B
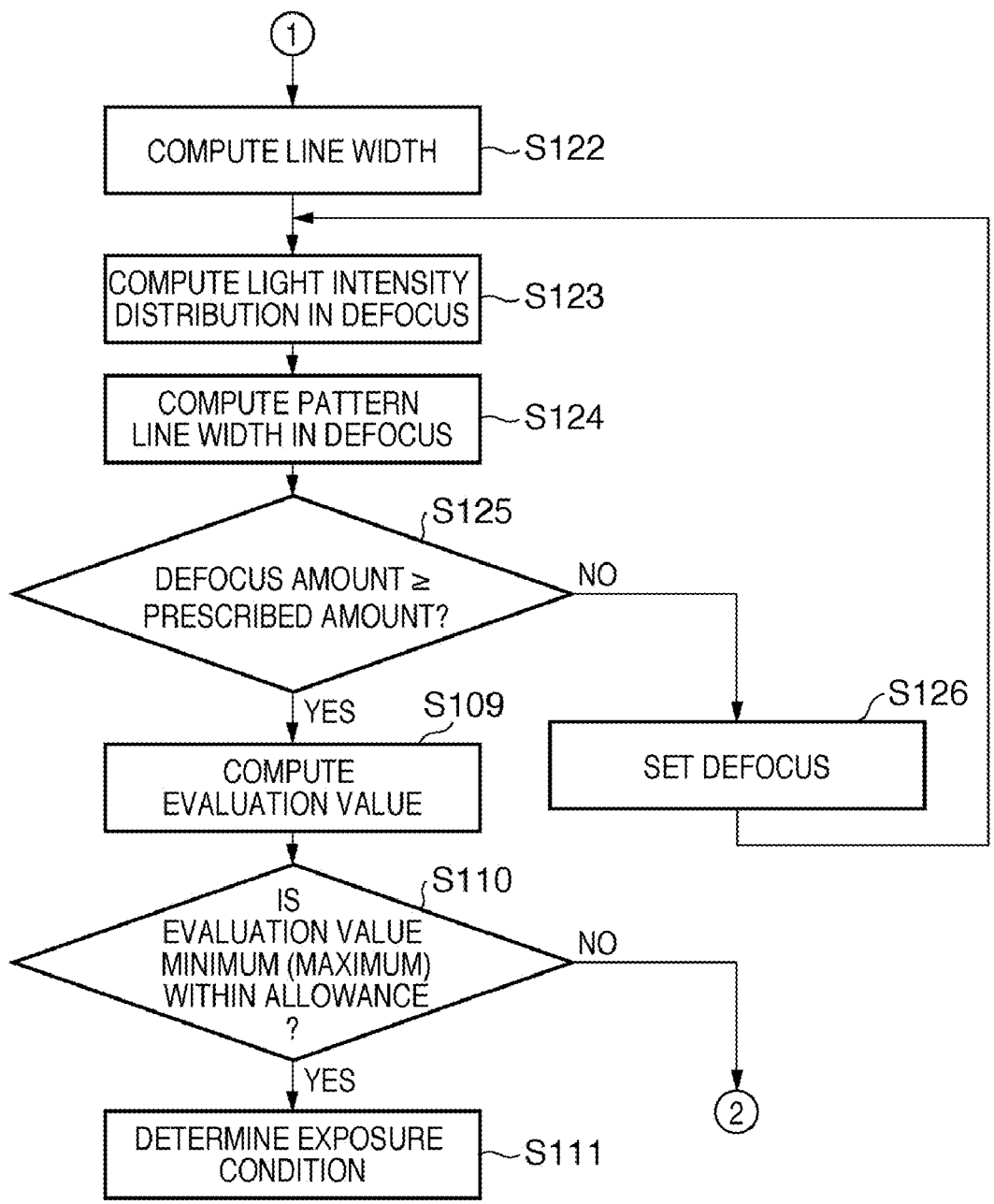

EXPOSURE METHOD AND MEMORY MEDIUM STORING COMPUTER PROGRAM

BACKGROUND OF THE INVENTION

1. Field of the Invention

The present invention relates to an exposure method and a memory medium storing a computer program.

2. Description of the Related Art

In the process of manufacturing a semiconductor device, exposure processing by an exposure apparatus is critical in determining the line width of the circuit pattern of the semiconductor device. In the exposure processing, an original is illuminated with light from a light source by an illumination optical system to project the pattern of the original onto a photoresist on a substrate via a projection optical system, thereby exposing the photoresist.

Along with the recent decrease in the circuit line width, an exposure apparatus which incorporates techniques for attaining a high resolution has been developed. Parameters which determine the resolution are the wavelength of the light source, the numerical aperture (NA) of the projection optical system, and a numeric value associated with the process (the so-called process factor K1). To attain a high resolution, there are techniques of increasing the NA and of reducing the process factor K1. Examples of the technique of reducing the process factor are modified illumination, polarized illumination, and aberration adjustment of the projection optical system.

Current techniques for attaining a high resolution have become diversified and complicated. Under the circumstances, to transfer a pattern onto a substrate with high accuracy, various parameters associated with these techniques are to be determined. Examples of these parameters are the light intensity distribution (to be referred to as the effective light source distribution hereinafter) on the pupil plane of the illumination optical system, the NA and aberration of the projection optical system, and the polarization state of the illumination light.

In the process of manufacturing a semiconductor device, one factor for the strictest precision in order to determine the yield of the device is dimensional accuracy. Dimensional accuracy is increasingly becoming higher along with a decrease in the pattern line width. This has led to a growing need to optimize various kinds of exposure conditions so as to increase dimensional accuracy to a line width value or less.

Japanese Patent Laid-Open No. 2004-247737 relates to a method of optimizing the effective light source shape. More specifically, this patent reference describes a method of optimizing an effective light source by dividing the effective light source into point sources conforming to a grating pattern and evaluating the divided point sources. This patent reference also describes a method of evaluating the critical dimension (CD), the depth of focus (DOF), the exposure allowance (EL), the depth of focus in an exposure allowance of 8% (DOF@8%EL), the dose-to-size ratio (E1:1), a dense/isolated shape bias, and an arbitrary bias attributed to the shape size. This patent reference also describes a method of evaluating side-lobe transfer, a film loss, the sidewall angle, a mask error enhancement factor (MEEF), the linear resolution, and the absolute resolution.

In the optimization of various parameters, determining the exposure condition while changing the values of individual parameters across the whole range of figures expected to be taken using these values may take a very large amount of time.

SUMMARY OF THE INVENTION

The present invention provides a technique for determining the exposure condition in a shorter period of time.

One of the aspects of the present invention provides a method of exposing a substrate located on an image plane of a projection optical system by illuminating an original located on an object plane of the projection optical system with an illumination optical system to form an image on the image plane, the method comprising determining an exposure condition by executing a process including computing a first image formed on the image plane under the current exposure condition, and evaluating a line width of the first computed image, and exposing the substrate under the determined exposure condition, wherein the determining includes, computing a simplified evaluation value of the first computed image, changing the exposure condition and executing the process in the changed exposure condition, after evaluating the first computed image if the simplified evaluation value satisfies an allowable value, and changing the exposure condition and executing the process in the changed exposure condition without evaluating the first computed image if the simplified evaluation value does not satisfy the allowable value.

Further features of the present invention will become apparent from the following description of exemplary embodiments with reference to the attached drawings.

BRIEF DESCRIPTION OF THE DRAWINGS

FIGS. 12A to 12D are charts exemplifying the effective light source distributions;

FIGS. 14A and 14B are a flowchart showing the sequence of a method of determining the exposure condition according to the second embodiment;

DESCRIPTION OF THE EMBODIMENTS

Various embodiment of the present invention will be described below with reference to the accompanying drawings.

Figure 2:
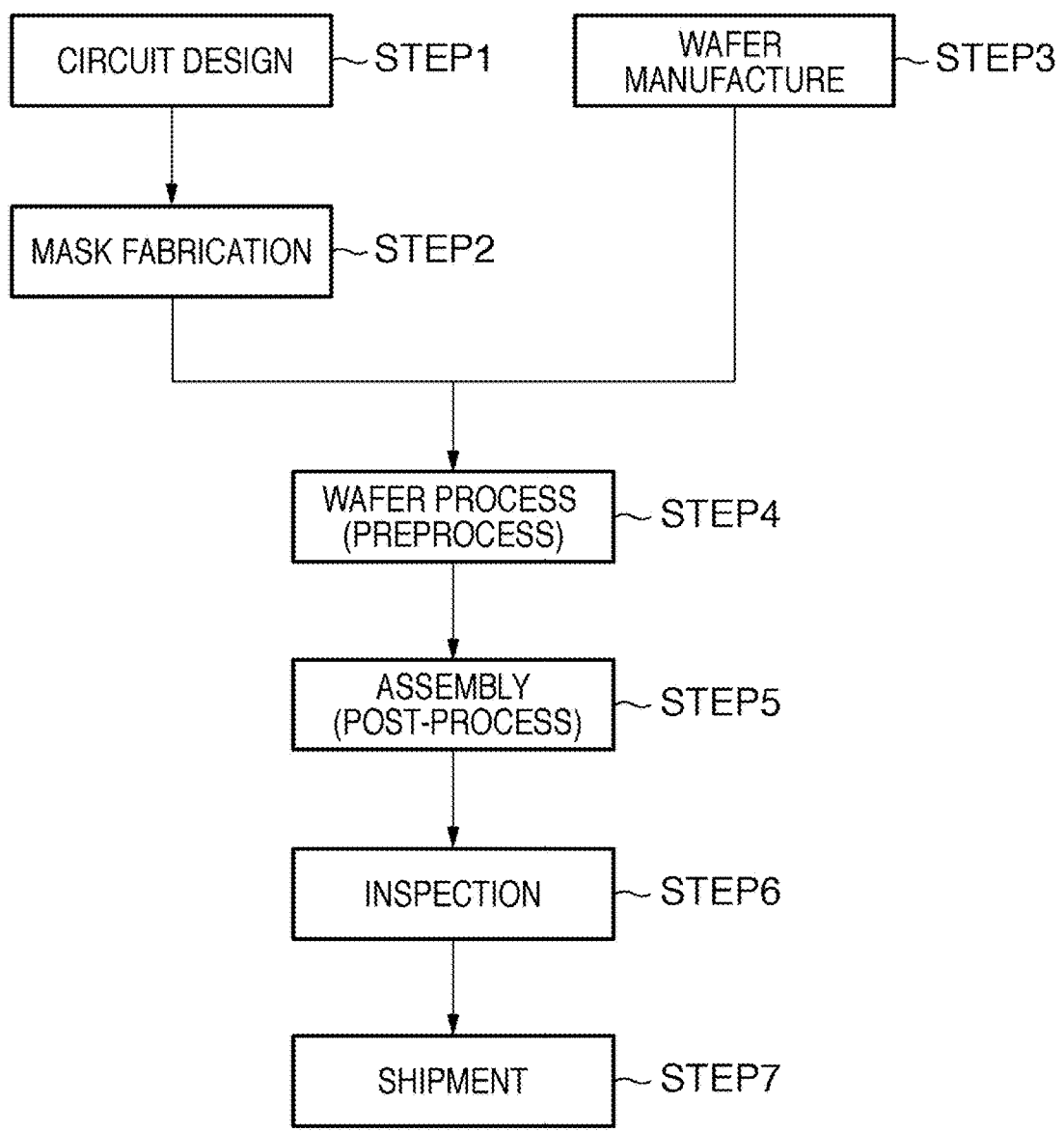
FIG. 2 is a flowchart exemplifying a device manufacturing method.

The process of manufacturing a device will be explained first with reference to FIGS. 2 and 3. FIG. 2 is a flowchart for explaining the process of manufacturing a device. Examples of the device are semiconductor chips such as an LSI, an IC, and a memory, display devices such as a liquid crystal panel, and image sensors such as a CCD and a CMOS sensor. The manufacture of a semiconductor chip will be explained herein as one example.

In step 1 (circuit design), the circuit of a semiconductor chip is designed. In step 2 (mask fabrication), a mask (original) on which a designed circuit pattern is formed is fabricated. In step 3 (wafer manufacture), a wafer is manufactured using a material such as silicon. In step 4 (wafer process) called a pre-process, a circuit is formed on the wafer by lithography using the mask and wafer. In step 5 (assembly) called a post-process, the wafer manufactured in step 4 is processed in chip form to form a semiconductor chip. This step includes an assembly step (dicing and bonding) and a packaging step (chip encapsulation). In step 6 (inspection), the semiconductor chip formed in step 5 undergoes inspections such as an operation confirmation test and a durability test. In step 7 (shipment), the semiconductor chip completed after the foregoing process is shipped.

Figure 4:
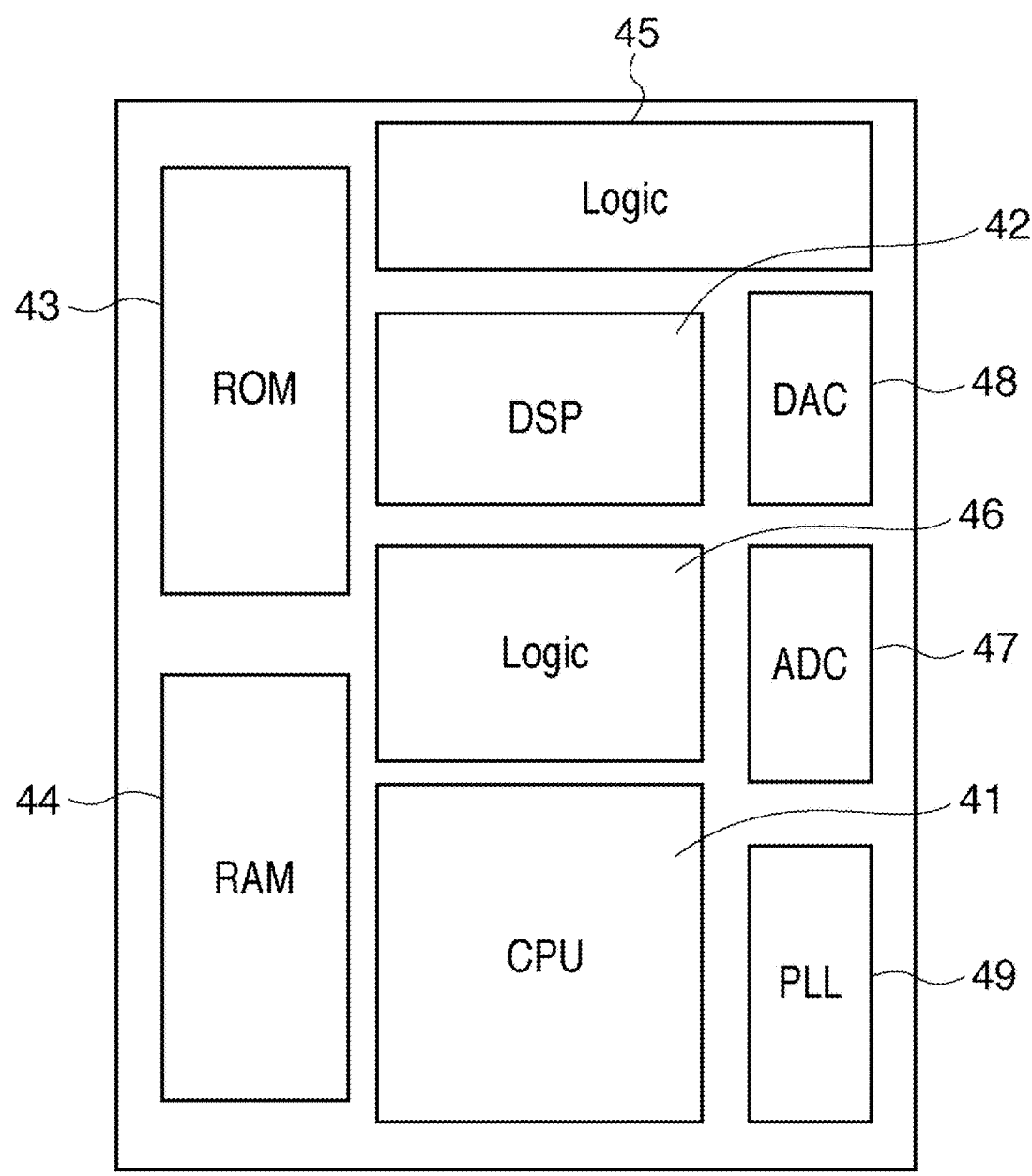
FIG. 4 is a view exemplifying the layout of LSI blocks.

Step 1 (circuit design) will be explained herein. The design of an LSI will be explained herein as one example. In the design of an LSI, system design is performed first. In the system design, the specification of an LSI is determined, thereby dividing the system involved into hardware and software, and further dividing the hardware into blocks. In general, an LSI can include a plurality of blocks. The diversity of these blocks can range from a circuit, having a small logic gate, such as a flip-flop to large-scale blocks such as a CPU and a DSP. For example, one LSI can include blocks (also called macrocells) such as a CPU 41, DSP 42, ROM 43, RAM 44, logics 45 and 46, ADC 47, DAC 48, and PLL 49, as shown in FIG. 4.

Logic design of the LSI is then performed. In the logic design, a logic circuit that implements hardware of the system designed by the system design is generated automatically. Ultimately, a logic circuit is generated that is equal in level to the gate of a transistor serving as the circuit element of a semiconductor device.

Layout design of the LSI is then performed. In the layout design, the arrangement of the blocks, each including a logic circuit with a gate level, in an LSI chip is determined, and an interconnection which connects these blocks is designed.

Data (to be referred to as layout data hereinafter) regarding the circuit pattern (to be referred to as the mask pattern hereinafter) of the LSI having undergone the layout design and its preceding design operations in this way is used in the embodiments to be described later. Note that data obtained by adding assist patterns, which allow optical proximity effect correction to the mask pattern, may be used.

Figure 3:
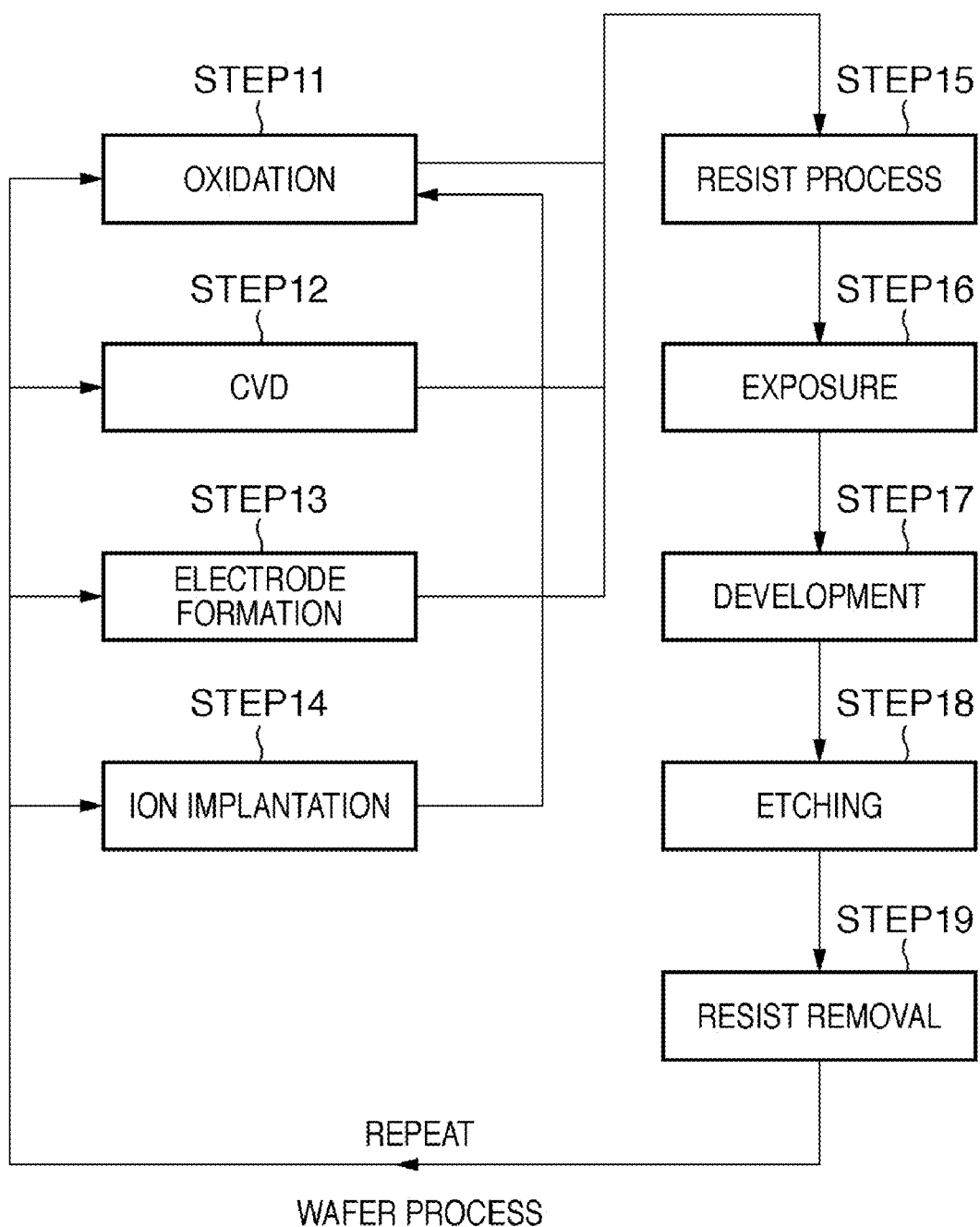
FIG. 3 is a flowchart exemplifying the device manufacturing method.

FIG. 3 is a flowchart illustrating details of the wafer process in step 4. In step 11 (oxidation), the wafer surface is oxidized. In step 12 (CVD), an insulating film is formed on the wafer surface. In step 13 (electrode formation), an electrode is formed on the wafer by, for example, vapor deposition. In step 14 (ion implantation), ions are implanted into the wafer. In step 15 (resist process), a photoresist is applied on the wafer. In step 16 (exposure), the circuit pattern of the mask (original) is projected onto the wafer coated with the photoresist to expose the photoresist. In step 17 (development), the exposed photoresist is developed to form a mask pattern. In step 18 (etching), portions exposed through the openings of the mask pattern are etched. In step 19 (resist removal), any unnecessary mask pattern remaining after the etching is removed. By repeating these steps, a circuit pattern is formed on the wafer.

Figure 5:
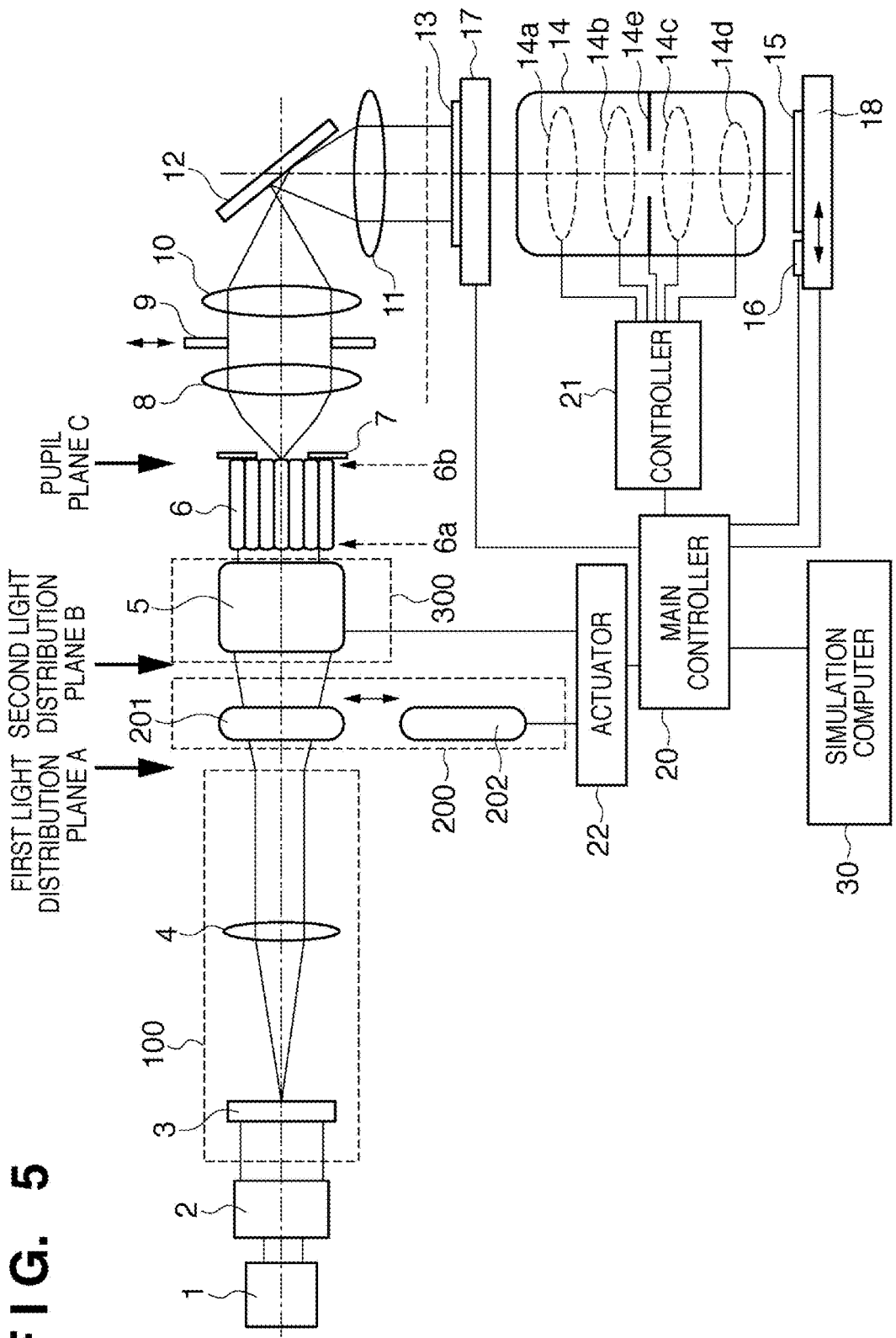
FIG. 5 is a view exemplifying the schematic arrangement of an exposure apparatus according to an embodiment of the present invention.

An exposure apparatus for use in the exposure processing in step 16 will be explained next with reference to FIG. 5. An optical system including optical components inserted between a light source 1 and a mask (original) 13 is called an illumination optical system. The light source 1 can be, for example, a superhigh pressure mercury lamp or excimer laser which emits light in the ultraviolet range or far-ultraviolet range. Light emitted by the light source 1 is converted into a targeted light beam shape by a light beam shaping optical system 2, and enters a diffraction optical element 3.

The diffraction optical element 3 diffracts the incident light to form a targeted first light distribution on the Fourier-transform plane via a Fourier-transform lens 4. The diffraction optical element 3 can be switched in accordance with an effective light source distribution to be formed.

A zoom optical system 5 forms an image of the light beam, which comes from the first light distribution and reaches the zoom optical system 5, on an incident surface 6a of a fly-eye lens 6 at a predetermined magnification. The zoom optical system 5 also has a function of adjusting the region in which the light beam enters the zoom optical system 5 and the fly-eye lens 6, and therefore can change the illumination conditions such as the effective light source distribution.

The diffraction optical element 3 and the Fourier-transform lens 4 form a first optical unit 100, illumination shape converters 201 and 202 form a second optical unit 200, and the zoom optical system 5 forms a third optical unit 300. Also, light intensity distributions formed by the first optical unit 100, the second optical unit 200, and the third optical unit 300 are defined as a first light distribution A, a second light distribution B, and a pupil plane distribution C, respectively. The pupil plane distribution C is synonymous with both the effective light source distribution and the angular distribution of the incident light on the irradiation surface (the mask 13).

The effective light source distribution depends on the combination of optical units. A unit which is directly involved in the formation of an effective light source distribution is called an effective light source distribution forming unit. The effective light source distribution forming unit refers to optical components inserted into the optical path from the diffraction optical element 3 to a stop member 7, as shown in FIG. 5.

The first to third optical units 100 to 300 convert a light beam from the light source 1 into that having a targeted shape to adjust the light intensity distribution on the incident surface 6a of the fly-eye lens 6 and the angular distribution of the incident light beam into targeted distributions. With this operation, the light intensity distribution (effective light source distribution) on the pupil plane of the illumination optical system is adjusted.

Figure 8A:
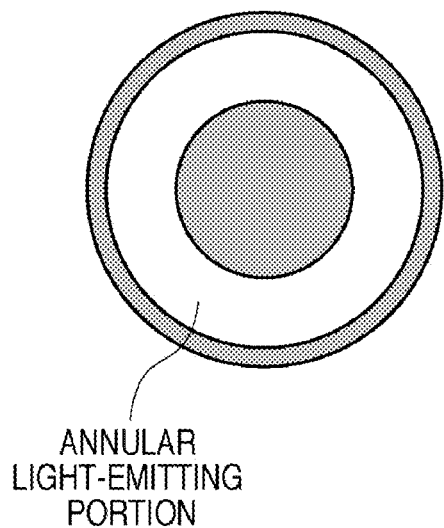
FIG. 8A is a view exemplifying the effective light source distribution in annular illumination.
Figure 8B:
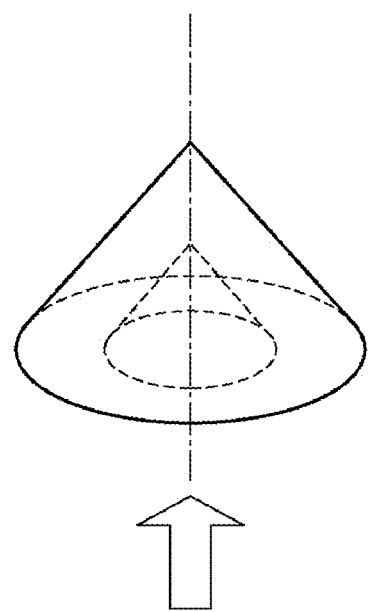
FIG. 8B is a view exemplifying a conical prism for forming a distribution as shown in FIG. 8A.

The second optical unit 200 will be described in detail below. To form a conventionally well-known annular effective light source distribution (FIG. 8A), the illumination shape converters each can be a prism which has a concave conical surface (or a flat surface) on its light incident side, and a convex conical surface on its light exit side, as shown in FIG. 8B.

Figure 9A:
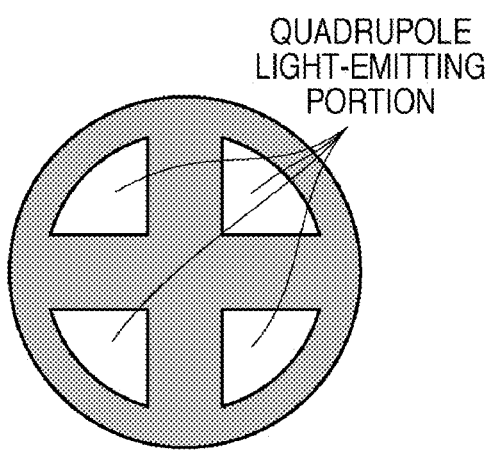
FIG. 9A is a view exemplifying the effective light source distribution in multipole illumination.
Figure 9B:
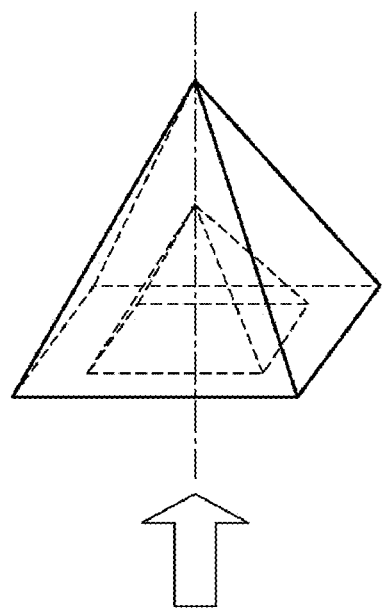
FIG. 9B is a view exemplifying a pyramidal prism for forming a distribution as shown in FIG. 9A.

To form a quadrupole effective light source distribution (FIG. 9A), the illumination shape converters each can be a prism which has a concave quadrangular pyramidal surface (or a flat surface) on its incident side, and a convex quadrangular pyramidal surface on its exit side, as shown in FIG. 9B. The angles between the optical axis and the edges of the quadrangular pyramids of the incident and exit surfaces of the prism may be equal to or different from each other in order to improve the illumination efficiency (the same applies to a conical prism). Alternatively, quadrupole illumination can be formed by forming a quadrupole first light distribution by the diffraction optical element 3, and providing a prism that has a concave conical surface (or a flat surface) on its incident side, and a convex conical surface on its exit side.

Figure 10A:
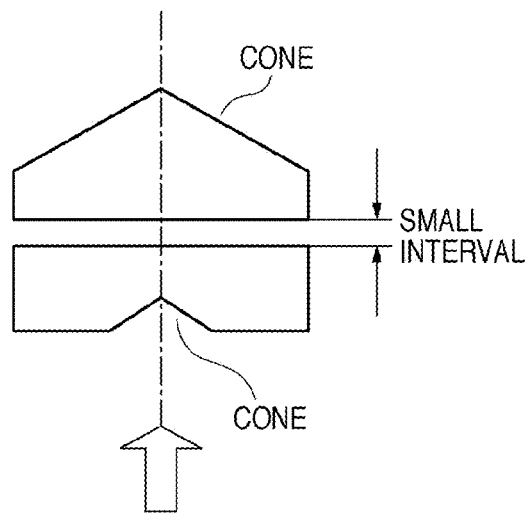
FIG. 10A is a view exemplifying an arrangement of a conical prism.
Figure 11A:
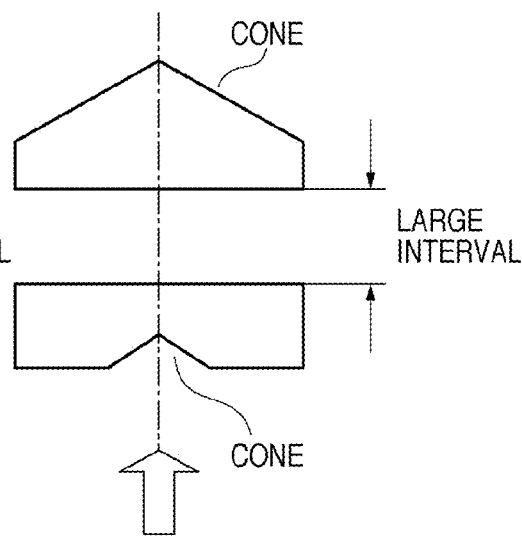
FIG. 11A is a view exemplifying another arrangement of a conical prism.
Figure 10B:
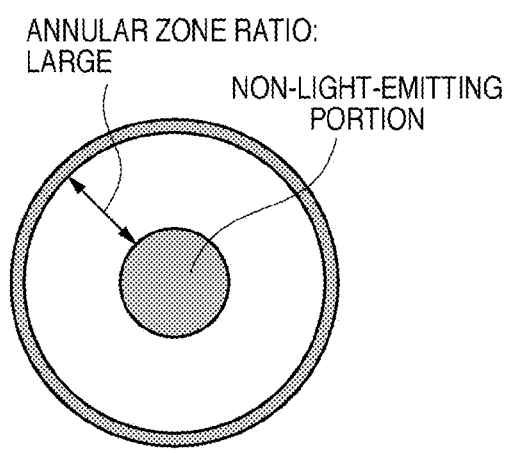
FIG. 10B is a view exemplifying an effective light source distribution corresponding to the arrangement shown in FIG. 10A.
Figure 11B:
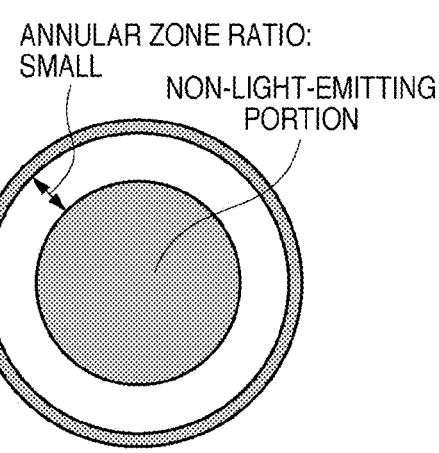
FIG. 11B is a view illustrating an effective light source distribution corresponding to the arrangement shown in FIG. 11A.

A greater variety of effective light source distributions can be formed by configuring each illumination shape converter as a pair of prisms to be relatively movable in the optical axis direction, as shown in FIGS. 10A and 11A. The pair of prisms shown in FIGS. 10A and 11A include a prism having a concave conical incident surface and a flat exit surface, and that having a flat incident surface and a convex conical exit surface. If the interval between these prisms is small, an annular effective light source distribution having a light-emitting portion with a large width (with a large annular zone ratio) is formed, as shown in FIG. 10B. On the other hand, if the interval between these prisms is large, an annular effective light source distribution having a light-emitting portion with a small width (with a small annular zone ratio) is formed, as shown in FIG. 11B.

The third optical unit 300 will be described in detail below. FIG. 12A shows an example of the light intensity in the cross-section of the effective light source distribution. In response to a change in the size of the effective light source distribution by adjusting the zoom optical system 5 which constitutes the third optical unit 300, the cross-section light intensity can change from the state shown in FIG. 12A to that shown in FIG. 12B. At this time, the effective light source distribution can change from the state shown in FIG. 12C to that shown in FIG. 12D. The zoom optical system 5 can be configured to adjust the size (the σ value) of the effective light source distribution while maintaining a given annular zone ratio.

To form, for example, an annular effective light source distribution (FIG. 8A) with the above-mentioned configuration, the first optical unit 100 forms a circular first light distribution A. Also, the second optical unit 200 forms an annular second light distribution B. Then, the annular zone ratio (the quotient obtained by dividing the inner diameter (inner σ) of the annular shape by its outer diameter (outer σ) can be adjusted by driving the optical elements (prisms) in the second optical unit 200. Moreover, the third optical unit 300 can adjust the size of the effective light source distribution while maintaining a given shape of the second light distribution.

The fly-eye lens 6 is configured by two-dimensionally arraying a plurality of microlenses, and has an exit surface that corresponds to the pupil plane of the illumination optical system and on which a pupil plane distribution (effective light source distribution) is formed. A stop member 7 for forming a targeted distribution by shielding any unwanted light is located on the pupil plane of the illumination optical system. The stop member 7 has its aperture size and shape adjusted by a stop driving mechanism (not shown).

An irradiation lens 8 illuminates a field stop 9 by the light intensity distribution on the incident surface 6a of the fly-eye lens 6. The field stop 9 includes a plurality of movable light-shielding plates, and limits the exposure range on the surface of the mask 13 (eventually, the surface of a wafer 15) serving as the irradiation target surface so as to form an arbitrary aperture shape of the field stop 9. Imaging lenses 10 and 11 project the aperture shape of the field stop 9 onto the mask 13. A deflecting mirror 12 deflects the optical path between the imaging lenses 10 and 11.

The mask (original) 13 is held by a mask stage 17, which is driven by a mask stage driving device (not shown).

A projection optical system 14 forms an image of the pattern of the mask 13, which is illuminated by the illumination optical system, on the wafer (substrate) 15 to expose the wafer 15. As the mask 13 and the mask stage 17 are retracted outside the optical path, a light amount distribution (light intensity distribution) similar to the effective light source distribution is formed on a pupil plane of the projection optical system 14. Note that the effective light source distribution corresponds to the angular distribution of exposure light which strikes the surface of the mask 13, and is associated with a light amount distribution (light intensity distribution) formed on the pupil plane of the projection optical system 14 when the mask 13 is not located on the object plane. Note also that the pupil plane of the projection optical system 14 is optically conjugate to that of the illumination optical system.

The wafer 15 is held by a wafer stage 18, which moves in the optical axis direction of the projection optical system 14 and along a plane perpendicular to the optical axis. The wafer stage 18 is driven by a wafer stage driving device (not shown).

A detector 16 is mounted on the wafer stage 18 so as to detect the amount of exposure light which strikes the plane on which the wafer 15 is located. The wafer stage 18 is driven so that the detector 16 moves along the plane on which the wafer 15 is located. The signal detected by the detector 16 at this time is sent to a main controller 20.

The main controller 20 adjusts the effective light source distribution by controlling an actuator 22.

In accordance with a command from the main controller 20, a controller 21 controls the driving of optical elements 14a to 14d in the projection optical system 14 and the aberration of the projection optical system 14. In accordance with another command from the main controller 20, the controller 21 controls an NA stop 14e arranged in the pupil plane of the projection optical system 14 to adjust the NA of the projection optical system 14. The main controller 20 is connected to the computer 30.

Figure 6:
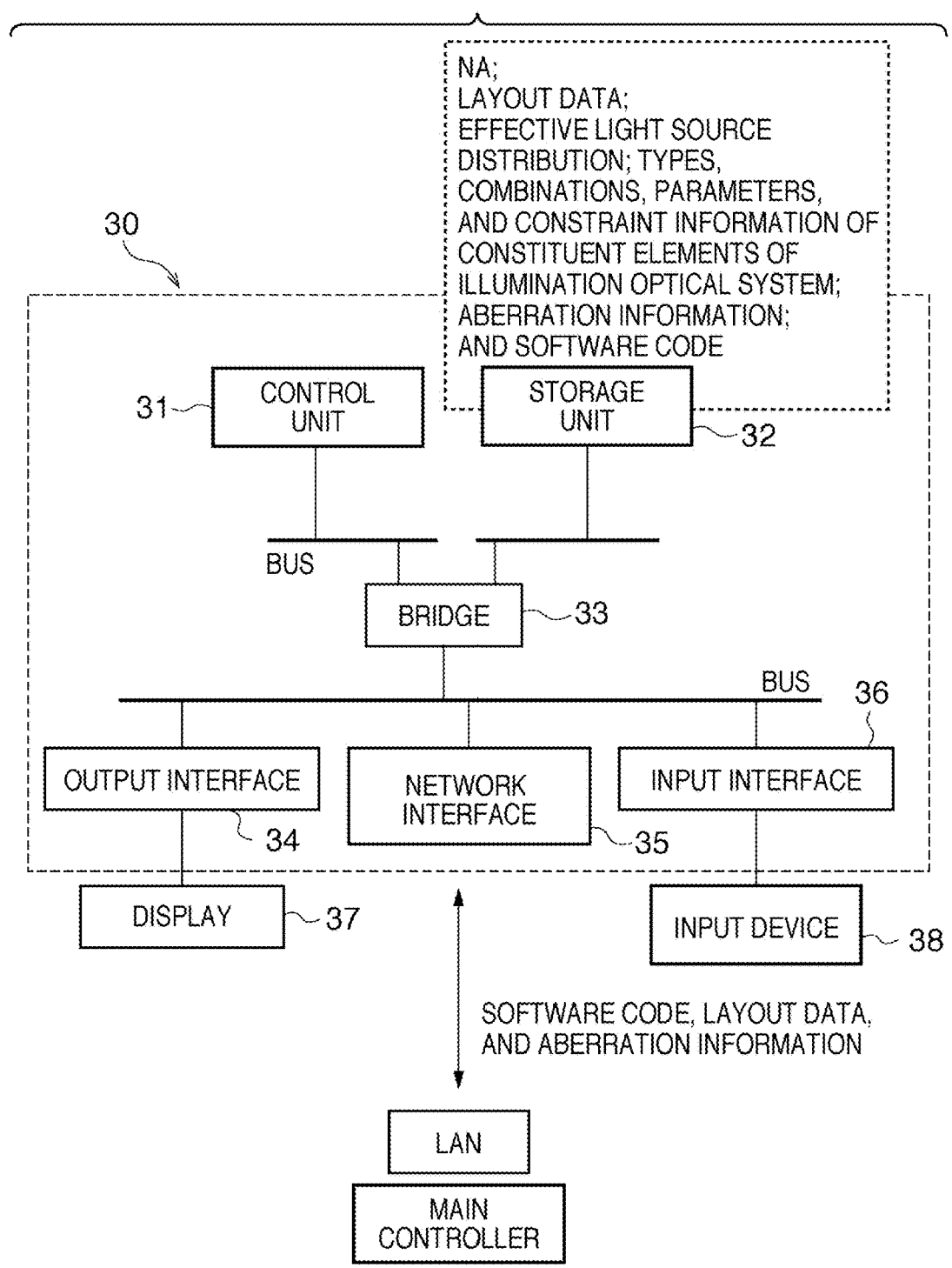
FIG. 6 is a block diagram showing an example of the configuration of a computer that executes a program for determining the exposure condition.

FIG. 6 is a block diagram showing an example of the configuration of the computer 30. The computer 30 executes a program for determining the exposure condition. The computer 30 includes a control unit 31, storage unit 32, bridge 33, output interface 34, network interface 35, and input interface 36. The control unit 31, storage unit 32, output interface 34, network interface 35, and input interface 36 are individually connected to the bridge 33 via buses. The output interface 34 is connected to a display 37, and the input interface 36 is connected to an input device 38. The network interface 35 is connected to a network such as a LAN, and therefore can perform data communication with other computers. The network interface 35 is also connected to the main controller 20 of the exposure apparatus.

The control unit 31 can include, for example, a CPU (Central Processing Unit), a DSP (Digital Signal Processor), an FPGA (Field Programmable Gate Array), and a microcomputer. The storage unit 32 can include memories such as a ROM and a RAM. The input device 38 can include a mouse and keyboard. The control unit 31 executes a computer program (software code) stored in the storage unit 32 to control the computer 30 to function as a device that executes a process or method according to the computer program. The result of the process according to the computer program can be output to the display 37, other output devices, and/or the main controller 20 via the output interface 34. The storage unit 32 can store not only the computer program but also the NA, the layout data of a device to be manufactured, the effective light source distribution, the types, combinations, parameters, and constraint information of constituent elements of the illumination optical system, and the aberration information of the projection optical system. The layout data and the aberration information of the projection optical system can be provided to the computer 30 via the network interface 35 and stored in the storage unit 32. The computer program can be installed on the computer 30 via a memory medium or a network.

Figure 1:
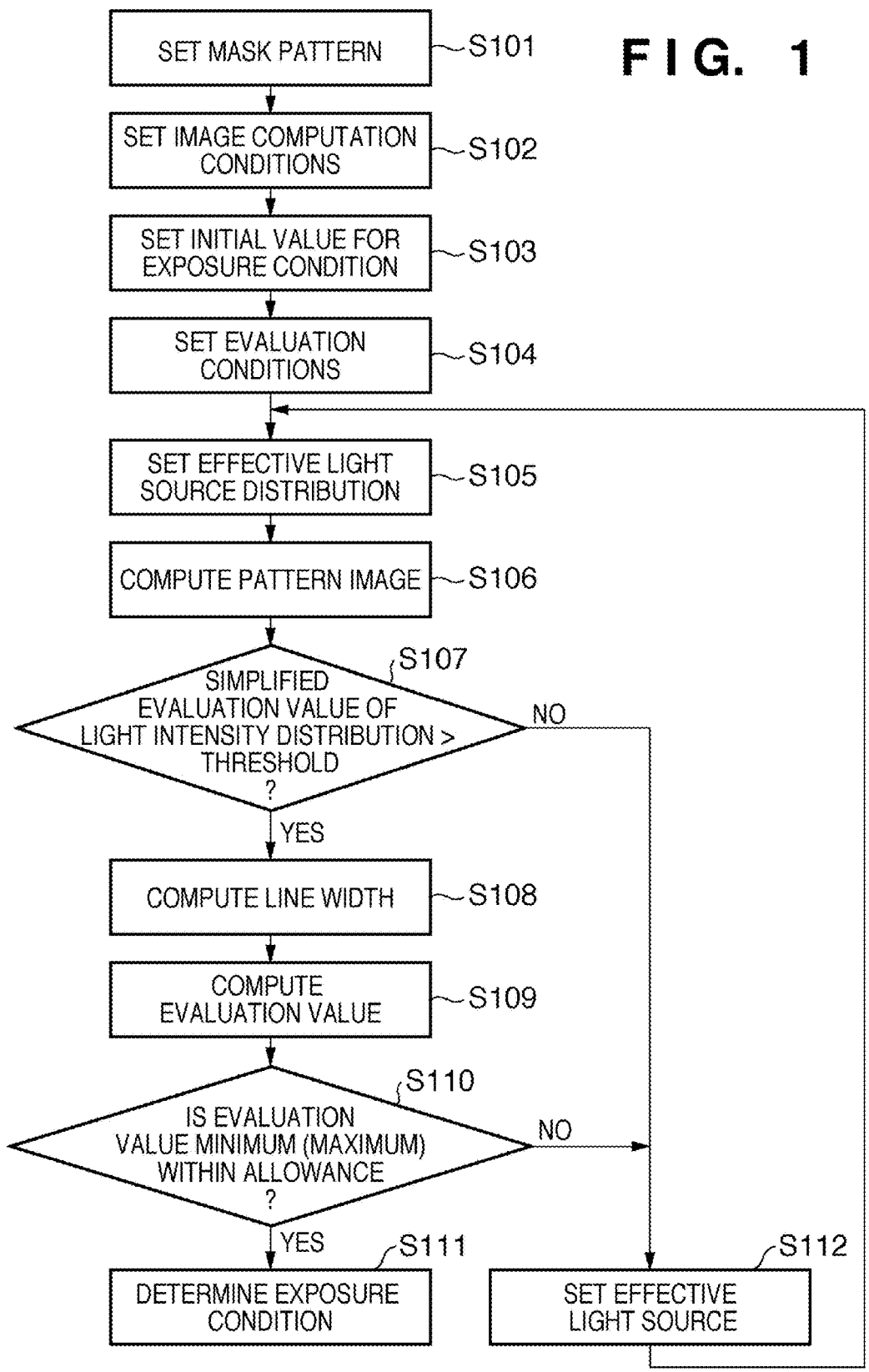
FIG. 1 is a flowchart showing the sequence of a method of determining the exposure condition according to the first embodiment.

FIG. 1 is a flowchart showing the sequence of a method of determining the exposure condition according to a first embodiment. To be more precise, a control unit 31 operates in accordance with a computer program (software code) stored in a storage unit 32, thereby executing the process shown in this flowchart. The method of determining the exposure condition will be explained below with reference to FIGS. 1, 7A to 7D, 13A, and 13B.

Figure 7A:
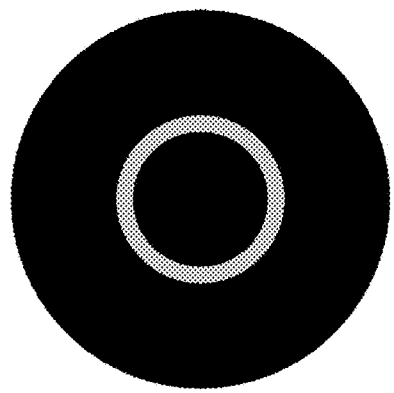
FIGS. 7A to 7D are views each for explaining an exemplary relationship between the effective light source distribution and an image formed on the image plane of a projection optical system.
Figure 7C:
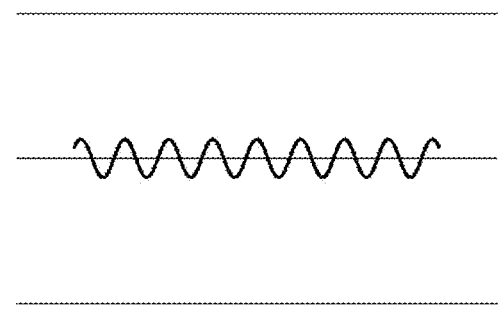
Figure 7B:
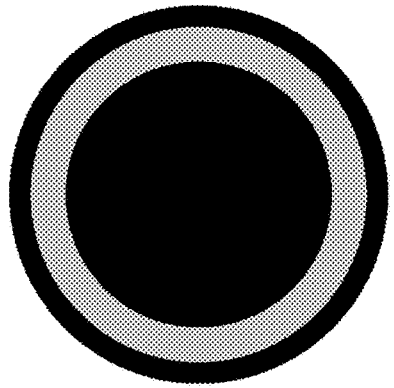
Figure 7D:
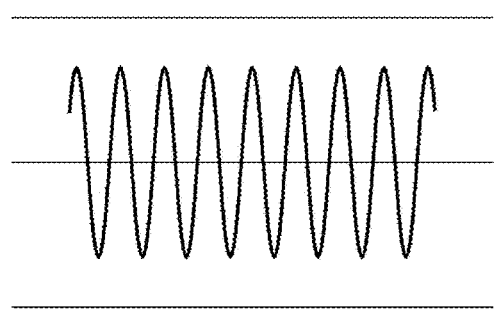

First, in step S101, a mask pattern (original pattern) is set. More specifically, in step S101, a mask pattern used to determine the exposure condition is set. This mask pattern is typically used only for evaluation but may also be used to manufacture an actual device. This embodiment will be explained assuming that the mask pattern is an L/S (line-and-space) pattern with line and space widths of 80 nm, shown in FIGS. 13A and 13B, as one example. FIG. 7C is a chart exemplifying an image formed on the image plane of a projection optical system 14 upon illumination of the mask pattern shown in FIGS. 13A and 13B by an effective light source distribution shown in FIG. 7A. FIG. 7D is a chart exemplifying an image formed on the image plane of the projection optical system 14 upon illumination of the mask pattern shown in FIGS. 13A and 13B by an effective light source distribution shown in FIG. 7B.

In step S102, to compute an image formed on the image plane of the projection optical system 14 (the plane on which a wafer 15 is located), fixed values in optimization are set. The NA of the projection optical system 14, the wavelength of the exposure light, and the aberration of the projection optical system 14, for example, can be set. Unique parameters may be set to compute that image. The unique parameters can include, for example, the number of division for use in Fourier transformation to compute that image, and resist-specific parameters when a resist image is to be obtained.

Assume that the exposure light has a wavelength of 193 nm, the projection optical system 14 has an NA (numerical aperture) of approximately 0.85, and annular illumination used has an annular zone ratio of 1/2 herein as one example. In addition, a resist (photoresist) is assumed to have a refractive index of approximately 1.7.

In step S103, an initial value is set for a parameter as the exposure condition to be optimized. For example, 0.8 can be set as the initial value of the outer σ of annular illumination.

Figure 13A:
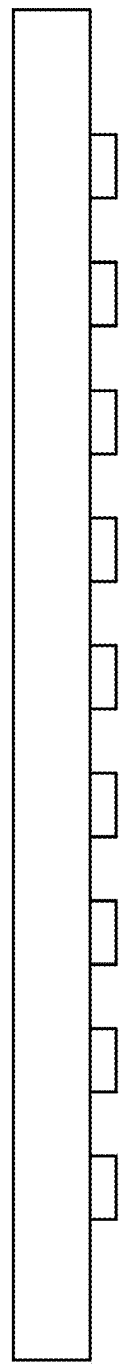
FIGS. 13A and 13B are views exemplifying a mask pattern.
Figure 13B:
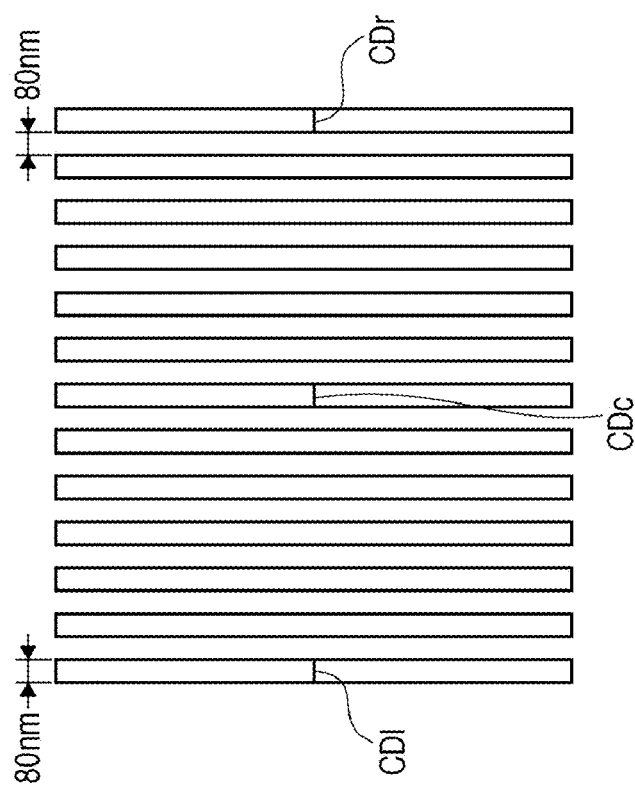

In step S104, the evaluation conditions are set. More specifically, evaluation points on the mask pattern, an evaluation equation for computing an evaluation value used to determine the exposure condition, and an allowable value in evaluation can be set. The evaluation points set can be a center line width CDc and end line widths CDl and CDr, as illustrated in FIGS. 13A and 13B. The center line width is the width of a line at the center of the L/S pattern, and the end line widths are the widths of lines at the ends of the L/S pattern. The differences between the line widths CDc, CDl, and CDr and their target line width are defined as ΔCDc, ΔCDl, and ΔCDr, respectively.

As the evaluation value set, an evaluation value ΔCD_RMS which is computed by an evaluation equation:

$$\Delta CD\_RMS = \{(\Delta CDc^2 + \Delta CDl^2 + \Delta CDr^2)/3\}^{1/2} \quad (1)$$

is used in this embodiment.

The allowable value in evaluation can be set as a condition in which, for example, the difference with respect to the target line width is less than or equal to 10 nm.

In step S105, the effective light source distribution is set. When step S105 is executed for the first time after step S103, an effective light source distribution corresponding to the initial value set in step S103 is set. In step S105 after step S112, an effective light source distribution corresponding to an option for the effective light source distribution (exposure condition) changed in step S112 is set. In this embodiment, the effective light source distribution is optimized while changing the outer σ in step S112.

The effective light source distribution can be optimized in accordance with, for example, a constraint given by the illumination optical system. More specifically, the optimization can be performed within the range of effective light source distributions which can be formed by selecting the optical units illustrated in FIGS. 8A, 8B, 9A, and 9B, adjusting the interval between the two prisms illustrated in FIGS. 10A, 10B, 11A, and 11B, and adjusting a zoom optical system 5. That is, a constraint given by the illumination optical system means the range of effective light source distributions that can be realized by the function of the current exposure apparatus. However, if a new function can be incorporated in the illumination optical system, it can also be set as the optimization target. For example, the prism shape defined by, for example, the angles of the prism edges with respect to the optical axis and the like can be the optimization targets.

An ideal distribution may be sought by optimizing an effective light source distribution. Typical examples of methods for obtaining such an ideal distribution are a method of making the light intensity uniform and representing, for example, the outer σ, the annular ratio, the aperture angle, and the aperture size as parameters, and a method of describing a certain component of the light intensity distribution using an expression (e.g., a polynomial, an exponential function, a Gaussian distribution, or another distribution function), and representing the coefficients in the expression as parameters.

The exposure condition to be optimized includes not only the effective light source distribution but also all kinds of parameters which can be adjusted and changed at the time of exposure. Examples of the optimization target are the polarization distribution of the illumination light, the center wavelength of the illumination light, the spectral shape of the illumination light (containing the information of the superposed shape of a plurality of different wavelengths), the NA, aberration, and pupil transmittance distribution of the projection optical system, and the angular characteristic of the reflectance on the resist surface.

In step S106 (image computation step), a pattern image formed on the image plane of the projection optical system 14 under the set condition (including the current effective light source distribution) is computed by optical simulation. More specifically, an image (light intensity distribution) formed on the image plane (the wafer surface) by the projection optical system 14 by illuminating the mask pattern located on the object plane of the projection optical system 14 by the illumination optical system is computed. This image is generally called an aerial image or an optical image.

In step S107, it is checked whether the simplified evaluation value of the aerial image (light intensity distribution) satisfies a threshold. If YES in step S107, the process advances to step S108. If NO in step S107, the process advances to step S112. An example of the simplified evaluation target is the cross-section of the aerial image (light intensity distribution) taken along the direction in which the evaluation points CDc, CDl, and CDr set in step S104 are evaluated. An example of the simplified evaluation value can be the minimum NILS (Normalized Image Log Slope) value of the NILS values obtained at three evaluation points CDc, CDl, and CDr. As is well known to those skilled in the art, the NILS value can be computed in accordance with:

$$\text{NILS value} = CD \times \partial \ln I / \partial x \quad (2)$$

where I is the light intensity, and lnI is the natural logarithm of the light intensity I.

Figure 16:
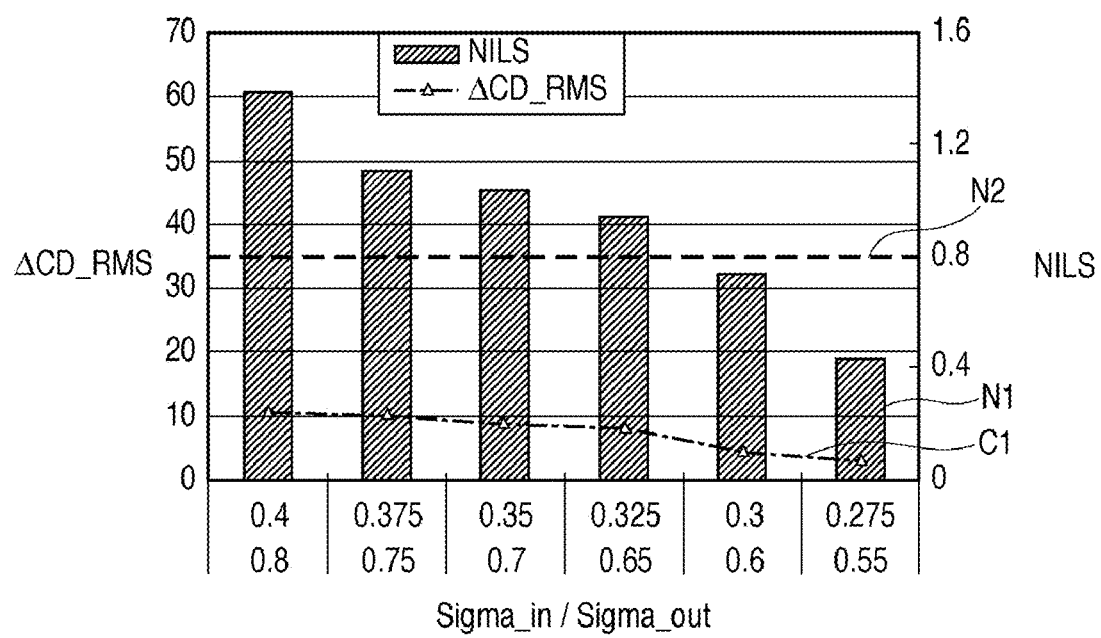
FIG. 16 is a bar graph exemplifying a simplified evaluation value and evaluation value corresponding to a change in the effective light source in the first embodiment.

The NILS value computed as the simplified evaluation value in step S107 is exemplified as N1 in FIG. 16. Also, the threshold is exemplified as N2 in FIG. 16.

Assume that the threshold N2 is 0.8. In this case, if the effective light source distribution set has an outer σ (indicated by "Sigma_out" in FIG. 16) of 0.60 or less in the example shown in FIG. 16, the NILS value as the simplified evaluation value does not satisfy the threshold N2, and NO is determined in step S107. Then, another option for the effective light source distribution is set in step S112, and step S105 and its subsequent steps (i.e., a series of optimization processes) are executed again. On the other hand, if the effective light source distribution set has an outer σ of 0.65 or more in the example shown in FIG. 16, the NILS value as the simplified evaluation value satisfies the threshold N2, and YES is determined in step S107. Then, the process advances to step S108.

In this manner, in this embodiment, a given exposure condition under which the simplified evaluation value does not satisfy a threshold is changed to another exposure condition without computing an evaluation value (to be described later) for the given exposure condition, and the optimization computation progresses. With this operation, the overall time taken for the optimization computation is shortened because an evaluation value is not computed for an exposure condition under which the simplified evaluation value does not satisfy a threshold (an evaluation value for this exposure condition naturally does not satisfy an evaluation criterion). As is obvious from the gist of the description above, the simplified evaluation value serves as an evaluation index which can be computed in a period of time shorter than that taken to compute an evaluation value (to be described later).

Although the minimum NILS value of the NILS values obtained at three evaluation points is selected as the simplified evaluation value in this embodiment, the NILS value of a pattern, having a minimum half pitch, of all patterns present on the same mask, for example, may be determined as the simplified evaluation value.

The simplified evaluation value need only allow evaluation of the degree of intensity of the light intensity distribution, and various kinds of evaluation values can be selected as the simplified evaluation value, in addition to a NILS value. The simplified evaluation value can be, for example, an imaging contrast value Cnt or an ILS (Image Log Slope) value respectively given by:

$$\text{Cnt} = (I\text{max} - I\text{min})/(I\text{max} + I\text{min}) \quad (3)$$

$$\text{ILS value} = \partial \ln I / \partial x \quad (4)$$

If a NILS value is used as the simplified evaluation value, a threshold N2 can be set within the range of $0.5 \leq N2 \leq 20$ in accordance with the manufacturing process. If a contrast value Cnt is used as the simplified evaluation value, a threshold Cnt2 can be set within the range of $0.25 \leq \text{Cnt2} \leq 0.6$ in accordance with the manufacturing process. If an ILS value is used as the simplified evaluation value, a threshold I2 can be set within the range of $1 \leq I2 \leq 50$ [1/μm] in accordance with the manufacturing process.

In step S108, the pattern line widths CDc, CDl, and CDr are computed based on the aerial image computed in step S106 for each evaluation point. This computation can exploit a fixed slice model, which is the simplest of the commonly used models. The fixed slice model is used to define the intersections between an aerial image and the slice level of a certain light intensity, at which the aerial image is sliced, as the two edges of the line width. The slice level can be selected such that the line width of the central pattern is a target value.

In step S109 (evaluation step), based on the line widths CDc, CDl, and CDr computed in step S108 and a target dimension of 80 nm, an evaluation value ΔCD_RMS is computed in accordance with:

$$\Delta CDc = CDc - 80$$

$$\Delta CDl = CDl - 80$$

$$\Delta CDr = CDr - 80$$

$$\Delta CD\_RMS = \{(\Delta CDc^2 + \Delta CDl^2 + \Delta CDr^2)/3\}^{1/2} \quad (5)$$

An evaluation value for each effective light source distribution is indicated by C1 in FIG. 16. Note that, for the sake of descriptive convenience, FIG. 16 also shows evaluation values ΔCD_RMS for effective light source distributions having NILS values which satisfy a threshold N2.

In step S110, it is checked whether the evaluation value computed in step S109 falls within an allowance and is an optimum value of the evaluation values computed for a plurality of exposure conditions (effective light sources). If a smaller evaluation value is better, the optimum value is a minimum value. If a larger evaluation value is better, the optimum value is a maximum value. Alternatively, the optimum value can be a specific value. If an RMS value ΔCD_RMS is adopted as the evaluation value, the optimum value is a minimum value because this RMS value is residual with respect to a target line width.

Assume that there are six options for the effective light source distribution, as illustrated in FIG. 16. In this case, when an effective light source distribution, with an outer σ=0.65 and an inner σ=0.325, which corresponds to an effective light source distribution having a NILS value N1 larger than the threshold N2 (i.e., the effective light source distribution for which YES is determined in step S107) and which exhibits a minimum evaluation value is specified, YES is determined in step S110. The specified effective light source distribution is then determined as the exposure condition in step S111.

Note that if a threshold N2 is not set for the NILS value, an effective light source distribution with an outer σ=0.55 and an inner σ=0.275 exhibits a minimum evaluation value, but selection of this distribution is expected to degrade the yield of a device to be manufactured.

In step S108, the line width may also be computed using a VTR or VBR obtained by modeling the influence of the resist process on the wafer, or a resist model obtained by convolution integration of the optical image while shifting it. Note that VTR and VBR are abbreviations for "Variable Threshold Resist Model" and "Variable Bias Resist Model", respectively.

A condition in which the process ends although the simplified evaluation value does not satisfy an allowable value if the number of executions of the determination in step S110 has reached a specified number, may be set to prevent infinite repetition of the computation. In this case, the optimization computation is to be performed again by changing at least one of the settings in steps S104, S103, S102, and S101.

In this manner, the use of the degree of intensity of the light intensity distribution as the simplified evaluation value allows not only the shortening of the overall time for the optimization but also the determination of an effective light source distribution which ensures a given exposure margin.

The exposure condition optimized using a computer 30 is provided to a main controller 20, which sets the exposure condition by controlling an actuator 22. This makes it possible to form a targeted imaging pattern on the wafer and ensure a given exposure margin.

A second embodiment of the present invention will be explained below. Note that details that are not particularly referred to herein can be the same as in the first embodiment. Differences from the first embodiment will be mainly described.

Figure 14A:
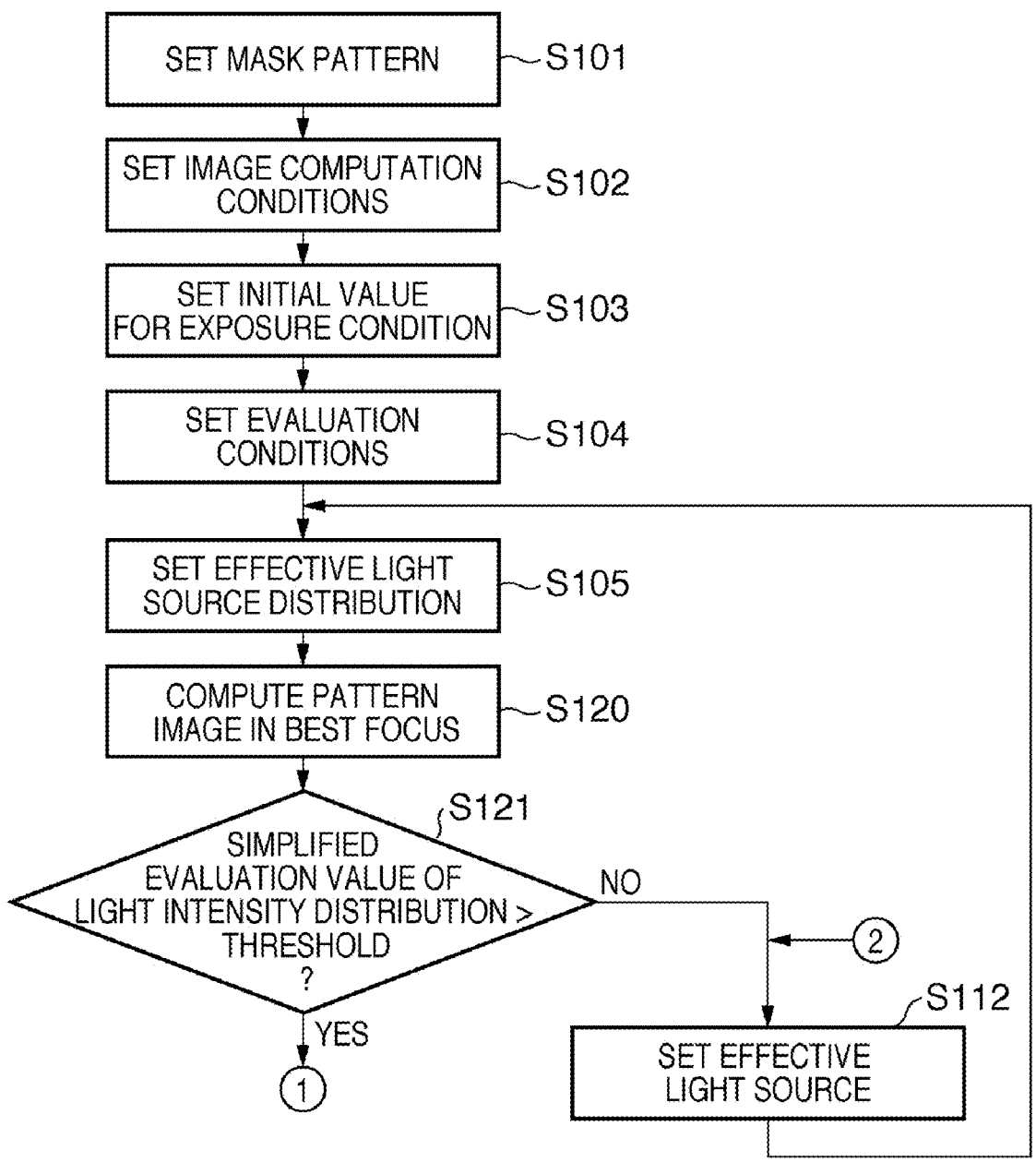

FIGS. 14A and 14B are a flowchart showing the sequence of a method of determining the exposure condition according to the second embodiment. To be more precise, a control unit 31 operates in accordance with a computer program (software code) stored in a storage unit 32, thereby executing the process shown in this flowchart. This embodiment provides the determining of an effective light source distribution which can mainly maximize the CD-DOF.

The CD-DOF is a parameter that typifies process errors, and serves as an index indicating the allowance of defocus in an exposure apparatus. The value of a DOF (Depth Of Focus) at which the CD is less than an allowable value of 10% is set herein as one example of the CD-DOF.

Figure 15:
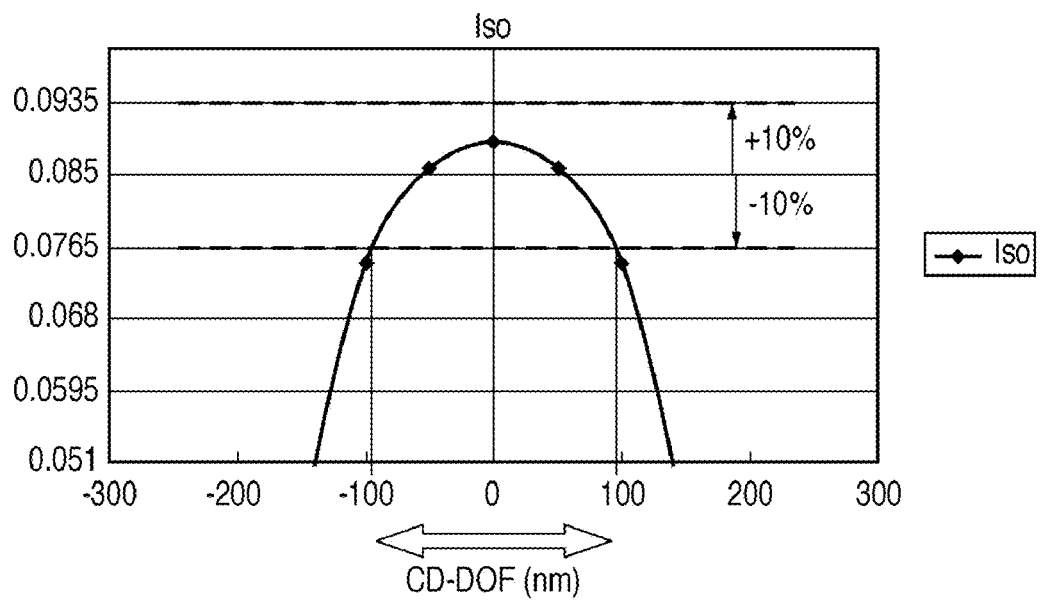
FIG. 15 is a graph exemplifying the CD-DOF according to the second embodiment.

FIG. 15 is a graph exemplifying the CD-DOF of an isolated pattern when the exposure light has a wavelength of approximately 193 nm, the projection optical system has a numerical aperture (NA) of approximately 0.85, and annular illumination used has an outer σ of approximately 0.7 and an inner σ of approximately 0.467. In FIG. 15, the abscissa indicates the defocus amount, and the ordinate indicates the line width. The function of these variables is fitted by, for example, a polynomial. The range in which the fitted curve falls within approximately ±10% of a target line width (85 nm in this case) is defined as the DOF.

After the effective light source distribution is computed in step S105, a pattern image at a best focus position is computed in step S120. Note that the process in step S120 is the same as that in step S106 in the first embodiment.

In step S121, it is checked whether the simplified evaluation value of the aerial image (light intensity distribution) computed in step S120 satisfies a threshold. If YES in step S121, the process advances to step S122. If NO in step S121, the process advances to step S112. An example of the simplified evaluation value can be the minimum NILS value of the NILS values obtained at three evaluation points CDc, CDl, and CDr. If the NILS value as the simplified evaluation value does not satisfy a threshold N2, NO is determined in step S121. In this case, another option for the effective light source distribution is set. On the other hand, if the NILS value as the simplified evaluation value satisfies the threshold N2, YES is determined in step S121, and the process advances to step S122.

In this manner, in this embodiment, a given exposure condition under which the simplified evaluation value does not satisfy a threshold is changed to another exposure condition without line width computation in best focus (S122) and evaluation in defocus (S123 to S125) for the given exposure condition, and the optimization computation progresses. With this operation, the overall time for the optimization computation is shortened.

At this time, if the NILS value of an image in best focus, which is expected to be formed with a maximum contrast, is smaller than a threshold, that of an image in defocus can be predicted to be naturally smaller than the threshold as well. Under the circumstances, a given exposure condition is changed, under which the simplified evaluation value does not satisfy a threshold, to another exposure condition without performing line width computation in best focus (S122) and evaluation in defocus (S123 to S125) for the given exposure condition, and progress the optimization computation, as described above.

In step S123 (second image computation step), a pattern image formed on a plane deviated from the image plane of a projection optical system 14 (a defocused plane) under the set condition (including the current effective light source distribution) is computed by optical simulation.

In step S124, the line width of the pattern image in defocus is computed. In step S125, it is checked whether the defocus amount has reached a prescribed amount. If YES in step S125, the process advances to step S109. If NO in step S125, another defocus amount is set in step S126, and a pattern image is computed again in step S123.

In step S109, an evaluation value (e.g., the DOF) is computed based on the line widths computed in steps S122 and S124.

In step S110, it is checked whether the evaluation value computed in step S109 falls within an allowance and is an optimum value of the evaluation values computed for a plurality of exposure conditions (effective light sources). When an effective light source distribution which exhibits an optimum evaluation value within an allowance is specified, YES is determined in step S110. The specified effective light source distribution is then determined as the exposure condition in step S111. With the foregoing process, an effective light source distribution can be determined that allows a maximum DOF to be obtained.

In this manner, when the optimization is performed by taking account of the line width in defocus in addition to that in best focus, the time for optimization is prolonged due to the large amount of computation. It is therefore, a given exposure condition is changed, under which the simplified evaluation value does not satisfy a threshold, to another exposure condition without any optimization processes concerning the given exposure condition, and progress the optimization computation.

In evaluation based on an ED-Window (Exposure-Dose-Window), the pattern line widths upon increasing and decreasing the exposure amount by 10% with respect to the slice level can be computed for each defocus amount setting.

An ED-Window is defined as a DOF at which the line width is less than an allowable value even when the exposure amount has changed by 10%, and therefore is an evaluation value which more strictly estimates fluctuation factors in the exposure process. The efficiency of determining the exposure condition dramatically improves by introducing an ED-Window as the evaluation amount as well and setting it to a threshold to evaluate the degree of intensity of the light intensity distribution with a best exposure amount in best focus, as in the foregoing examples of the evaluation value.

As described above, according to this embodiment, it is possible to shorten the overall time for the optimization in determining the exposure condition based on an evaluation value including the DOF.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-181977, filed Jul. 11, 2008, which is hereby incorporated by reference herein in its entirety.

What is claimed is:

1. A method of exposing a substrate via a projection optical system by illuminating an original with an illumination optical system, the method comprising:
   setting a tentative value of an exposure condition for determining an exposure condition value;
   setting a simplified evaluation condition for evaluating a degree of intensity of a light intensity distribution in an image plane of the projection optical system, and a line width evaluation condition for evaluating a line width of an image formed on the image plane;
   computing a light intensity distribution in the image plane using the tentative value and computing a simplified evaluation value by evaluating the computed light intensity distribution with the simplified evaluation condition;
   computing a line width of the image formed on the image plane and computing a line width evaluation value by evaluating the computed line width with the line width evaluation condition, if the simplified evaluation value satisfies a first allowable value; and
   determining the exposure condition value if the line width evaluation value satisfies a second allowable value;
   wherein the tentative value of the exposure condition is changed and the computing the light intensity distribution is performed again using the changed tentative value of the exposure condition, without performing the computing the line width if the simplified evaluation value does not satisfy the first allowable value,
   wherein the tentative value of exposure condition is changed if the simplified evaluation value satisfy the first allowable value but the line width evaluation value does not satisfy the second allowable value, and
   wherein in the determining the exposure condition value, the latest changed tentative value of the exposure condition is determined as the exposure condition value.

2. The method according to claim 1, wherein the simplified evaluation value is one of a NILS value, an ILS value, and a contrast value of a light intensity distribution in the image plane.

3. The method according to claim 1,
   wherein the computing the line width of the image includes computing a line width of an image formed at a plane deviated from the image plane and computing a line width evaluation value by evaluating the image formed on the image plane and the image formed at the plane deviated from the image plane with the line width evaluation condition.

4. The method according to claim 1, wherein the exposure condition includes an illumination condition.

5. The method according to claim 1, wherein the exposure condition includes an effective light source distribution.

6. A non-transitory memory medium storing a computer program for causing a computer to execute a method used in an exposure apparatus which exposes a substrate via a projection optical system by illuminating an original with an illumination optical system, the method comprising:
   setting a tentative value of an exposure condition for determining an exposure condition value;
   setting a simplified evaluation condition for evaluating a degree of intensity of a light intensity distribution in an image plane of the projection optical system, and a line width evaluation condition for evaluating a line width of an image formed on the image plane;
   computing a light intensity distribution in the image plane using the tentative value and computing a simplified evaluation value by evaluating the computed light intensity distribution with the simplified evaluation condition;
   computing a line width of the image formed on the image plane and computing a line width evaluation value by evaluating the computed line width with the line width evaluation condition, if the simplified evaluation value satisfies a first allowable value; and
   determining the exposure condition value if the line width evaluation value satisfies a second allowable value;
   wherein the tentative value of the exposure condition is changed and the computing the light intensity distribution is performed again using the changed tentative value of the exposure condition, without performing the computing the line width of the image, if the simplified evaluation value does not satisfy the first allowable value,
   wherein the tentative value of exposure condition is changed if the simplified evaluation value satisfies the first allowable value but the line width evaluation value does not satisfy the second allowable value, and
   wherein in the determining the exposure condition value, the latest changed tentative value of the exposure condition is determined as the exposure condition value.

7. The non-transitory memory medium according to claim 6, wherein the simplified evaluation value is one of a NILS value, an ILS value, and a contrast value of a light intensity distribution in the image plane.

8. The non-transitory memory medium according to claim 6, wherein the computing the line width of the image includes computing a line width of an image formed at a plane deviated from the image plane and computing a line width evaluation value by evaluating the image formed on the image plane and the image formed at the plane deviated from the image plane with the line width evaluation condition.

9. The non-transitory memory medium according to claim 6, wherein the exposure condition includes an illumination condition.

10. The non-transitory memory medium according to claim 6, wherein the exposure condition includes an effective light source distribution.

* * * * *